US011909363B2

(12) United States Patent
Van Ark

(10) Patent No.: US 11,909,363 B2
(45) Date of Patent: Feb. 20, 2024

(54) RF POWER AMPLIFIER WITH BALUN TRANSFORMER

(71) Applicant: PRODRIVE TECHNOLOGIES INNOVATION SERVICES B.V., Son (NL)

(72) Inventor: Bart Gerardus Maria Van Ark, Son (NL)

(73) Assignee: PRODRIVE TECHNOLOGIES INNOVATION SERVICES B.V., Son (NL)

( * ) Notice: Subject to any disclaimer, the term of this patent is extended or adjusted under 35 U.S.C. 154(b) by 518 days.

(21) Appl. No.: 17/276,561

(22) PCT Filed: Sep. 18, 2019

(86) PCT No.: PCT/EP2019/075068
§ 371 (c)(1),
(2) Date: Mar. 16, 2021

(87) PCT Pub. No.: WO2020/058361
PCT Pub. Date: Mar. 26, 2020

(65) Prior Publication Data
US 2022/0052657 A1    Feb. 17, 2022

(30) Foreign Application Priority Data

Sep. 18, 2018  (NL) ................................. 2021654
Nov. 9, 2018   (CN) ......................... 201821844427.X

(51) Int. Cl.
*H03F 3/187* (2006.01)
*H03F 3/24* (2006.01)
(Continued)

(52) U.S. Cl.
CPC ......... *H03F 3/245* (2013.01); *G01R 33/3614* (2013.01); *H01F 19/04* (2013.01);
(Continued)

(58) Field of Classification Search
CPC ...................................................... H03F 3/187
(Continued)

(56) References Cited

U.S. PATENT DOCUMENTS 9,813,031 B2 *  11/2017  Anderson ........... H01F 27/2804
2002/0113682 A1   8/2002  Gevorgian et al.
(Continued)

FOREIGN PATENT DOCUMENTS

| CN | 105933011 A | 9/2016 |
| EP | 0418538 B1  | 3/1995 |

OTHER PUBLICATIONS

International Search Report and Written Opinion of the International Searching Authority from the European Patent Office, in PCT/EP2019/075068 dated Nov. 21, 2019, which is an international application corresponding to this U.S. application.

*Primary Examiner* — Henry Choe
(74) *Attorney, Agent, or Firm* — Kolitch Romano Dascenzo Gates LLC

(57) ABSTRACT

A radiofrequency power amplifier includes a balun transformer and a plurality of power transistor pairs arranged in a push-pull configuration. The balun transformer has an unbalanced coil extending between a first single-ended signal terminal and a first reference, and a balanced coil extending between a first balanced signal terminal and a second balanced signal terminal. The balun transformer also includes an auxiliary coil electrically isolated from the unbalanced coil and the balanced coil. The auxiliary coil is inductively coupled to the unbalanced coil and extends between a third balanced signal terminal and a fourth balanced signal terminal forming a balanced combiner-divider. An output of a first one of the power transistor pairs is coupled to the first and second balanced signal terminals (Continued)

and an output of a second one of the power transistor pairs is coupled to the third and fourth balanced signal terminals.

19 Claims, 5 Drawing Sheets

(51) Int. Cl.
  *G01R 33/36* (2006.01)
  *H01F 19/04* (2006.01)
  *H01P 5/10* (2006.01)
  *H03F 3/195* (2006.01)

(52) U.S. Cl.
  CPC ............... *H01P 5/10* (2013.01); *H03F 3/195* (2013.01); *H03F 2200/06* (2013.01); *H03F 2200/451* (2013.01); *H03F 2200/537* (2013.01)

(58) Field of Classification Search
  USPC ...................................... 330/307, 251, 207 A
  See application file for complete search history.

(56) References Cited

U.S. PATENT DOCUMENTS

| 2002/0135422 | A1* | 9/2002 | Aoki ....................... H03F 3/604 |
| | | | 330/276 |
| 2010/0117737 | A1* | 5/2010 | Kondo .................... H03F 1/565 |
| | | | 330/276 |
| 2011/0063028 | A1* | 3/2011 | Kawakami .............. H03F 3/602 |
| | | | 330/252 |
| 2013/0157587 | A1 | 6/2013 | Blanchet et al. |
| 2014/0084700 | A1 | 3/2014 | Anderson et al. |
| 2014/0292327 | A1 | 10/2014 | Griswold et al. |
| 2017/0338783 | A1* | 11/2017 | Larcher ............... H03F 3/45475 |
| 2018/0309419 | A1* | 10/2018 | Xu ....................... H03F 3/45381 |
| 2020/0111605 | A1* | 4/2020 | Chayat ................. H01F 17/0013 |

* cited by examiner

RF POWER AMPLIFIER WITH BALUN TRANSFORMER

TECHNICAL FIELD

The present disclosure relates to a balun (Balanced-to-Unbalanced) transformer, which is an electrical component that is capable of converting unbalanced signals to balanced signals and vice versa. The present disclosure more specifically relates to a planar balun.

INTRODUCTION

Several applications such as magnetic resonance imaging (MRI) require high power levels (e.g. 20 kW) in a high frequency region (e.g. 64-128 MHz). Typically, this high power level is achieved by combining multiple smaller power amplifiers. Firstly, two power RF (radio frequency) transistors (e.g. metal-oxide-semiconductor field-effect transistors or MOSFETs) are used in a push-pull configuration, where a co-axial cable transmission line balun is used to convert the balanced signal to an un-balanced signal. A push-pull configuration is advantageous in impedance matching and wideband design due to the four times higher load impedance compared to a similar power amplifier that comprises two paralleled transistors.

Secondly, power combining techniques (e.g. Wilkinson, Gysel or Radial) are applied to increase the total system power. Moreover, the same techniques are used for power dividing in these applications. These power combining and dividing techniques inherently require additional components, which increases losses and costs. This is especially the case in high power applications, because here multiple power combiners are required to achieve the desired power.

It is known from CN 105933011, US 2013/0157587 and US 2014/0084700 to implement balun transformers in integrated circuits for wireless applications, i.e. the balun transformers are built on semiconductor substrates. These balun transformers have power ratings in the order of several mW up to 1 W which is several orders of magnitude lower than the power applications indicated above and are used for signals having much higher frequencies on the GHz level.

SUMMARY

The present disclosure relates to a planar balun topology for power combining, and to a power amplifier comprising such a balun. The present disclosure also relates to an MRI system comprising such a power amplifier and a method for power combining.

An aim of the present disclosure is to overcome the drawbacks of prior art high-power amplifiers, such as by providing an RF power amplifier that fulfils the long felt need to limit the amount of additional components that are required for combining or dividing power in high power applications.

Alternatively, it is an aim to provide a balun transformer for high power applications that enables to overcome the drawbacks of prior art high-power amplifiers.

Described herein are balun transformers comprising an unbalanced coil extending between a first single-ended signal terminal and a first reference and a balanced coil extending between a first balanced signal terminal and a second balanced signal terminal. The unbalanced coil and the balanced coil are inductively coupled and electrically isolated from each other. The balun transformer further comprises at least one auxiliary coil electrically isolated from the unbalanced coil and the balanced coil. The at least one auxiliary coil can be one of:

(i) inductively coupled to the balanced coil and extends between a second single-ended signal terminal and a second reference forming an unbalanced combiner-divider, or (ii) inductively coupled to the unbalanced coil and extends between a third balanced signal terminal and a fourth balanced signal terminal forming a balanced combiner-divider.

Advantageously, in the balun transformer of the previous paragraph, the balanced coil, the unbalanced coil and the auxiliary coil are arranged in a plurality of spaced apart parallel planes. Advantageously, the auxiliary coil of the balanced combiner-divider is arranged in a same one of the spaced apart parallel planes as the balanced coil, or wherein the auxiliary coil of the unbalanced combiner-divider is arranged in a same one of the spaced apart parallel planes as the unbalanced coil. Advantageously, the plurality of planes form layers of a printed circuit board.

Advantageously, in the balun transformer of any one of the two previous paragraphs, the balanced coil extends in symmetry with respect to a third reference port interposed between the first balanced signal terminal and the second balanced signal terminal. The symmetry can relate to symmetry with respect to an electrical quantity, such as electrical impedance. Alternatively, or in addition the symmetry can relate to geometrical symmetry. The first balanced signal terminal and the second balanced signal terminal are hence positioned such that the balanced coil has electrical and/or geometrical symmetry from the third reference port. Advantageously, the at least one auxiliary coil is inductively coupled to form a balanced combiner-divider and wherein the at least one auxiliary coil extends in (electrical and/or geometrical) symmetry with respect to a fourth reference port interposed between the third balanced signal terminal and the fourth balanced signal terminal. The third balanced signal terminal and the fourth balanced signal terminal are hence positioned such that the auxiliary coil has electrical and/or geometrical symmetry from the fourth reference port.

Advantageously, in the balun transformer of any one of the three previous paragraphs, the balanced coil of the unbalanced combiner-divider forms a figure-8 coil comprising a first lobe and a second lobe electrically connected to each other, wherein the first lobe is inductively coupled to the unbalanced coil and the second lobe is inductively coupled to the auxiliary coil, or wherein the unbalanced coil of the balanced combiner-divider forms a figure-8 coil comprising a first lobe and a second lobe electrically connected to each other, wherein the first lobe is inductively coupled to the balanced coil and the second lobe is inductively coupled to the auxiliary coil. Advantageously, the first lobe and the second lobe are conductively connected by parallel conductors arranged in different spaced apart parallel planes. In addition, or alternatively, the first lobe and the second lobe of the figure-8 coil are electrically connected such that an electric current flows in opposite senses in the first lobe and in the second lobe.

Advantageously, in the balun transformer of any one of the four previous paragraphs, a grounded conductor extends between the balanced coil and the auxiliary coil that are inductively coupled to the unbalanced coil of the balanced combiner-divider, or wherein a grounded conductor extends between unbalanced coil and the auxiliary coil that are inductively coupled to the balanced coil of the unbalanced combiner-divider.

Advantageously, in the balun transformer of any one of the five previous paragraphs, the balanced coil and the auxiliary coil of the balanced combiner-divider are configured in a series coupling, or wherein the unbalanced coil and the auxiliary coil of the unbalanced combiner divider are configured in a series coupling.

Advantageously, the balun transformer of any one of the six previous paragraphs further comprises a first capacitor, a second capacitor and a third capacitor, wherein the first capacitor is connected to the balanced coil forming a first parallel resonant tank circuit, wherein the second capacitor is connected to the unbalanced coil forming a second parallel resonant tank circuit, and wherein the third capacitor is connected to the auxiliary coil forming a third parallel resonant tank circuit.

According to an aspect of the present disclosure, the radiofrequency power amplifier comprises a balun transformer as described in any one of the seven previous paragraphs, wherein the balun transformer is configured as a balanced combiner, or alternatively a balanced divider. The radiofrequency power amplifier further comprises a plurality of power transistor pairs. Each power transistor pair is arranged in a push-pull configuration. An output of a first one of the plurality of power transistor pairs is coupled to the first and second balanced signal terminals. An output of a second one of the plurality of power transistor pairs is coupled to the third and fourth balanced signal terminals.

A balun transformer as described herein allows combining one or more balanced coils with one or more unbalanced coils. Furthermore, depending on the ratio of balanced coils versus unbalanced coils and the direction of power transfer (i.e. which coils are primary and which coils are secondary), the balun transformer functions as either a power combiner or a power divider.

A surprising benefit of a balun transformer as described herein is that it does not only limit the amount of additional components that are required for power combining or dividing, but can also be produced in an automated fashion, e.g. by printing it on a PCB. EP0418538B1 describes printing a simple planar balun transformer on a printed circuit board (PCB), which also eliminates some of the inherent disadvantages related to coaxial balun transformers, which are subject to performance variations due to related manufacturing methods. Preferably, a balun transformer as described herein is printed on a multilayer PCB, hence achieving a reproducible and automated high manufacturing quality.

Another surprising benefit is that a balun transformer as described herein eases the use of power transistors based on laterally-diffused metal-oxide semiconductor (LDMOS) technology, which are superior compared to other transistors based on for instance vertically-diffused metal-oxide semiconductor (VDMOS) technology because of higher robustness, better cooling options and a higher gain. Using the state of the art methods these transistors would require even more additional hardware for power combining or dividing, because these transistors typically have a limited maximum output power of approximately 1.5 kW, a low supply voltages of about 50V and a low transistor load impedance. According to the standard Faradays laws of induction, the impedance conversion ratio is proportional to the turns ratio squared between the primary side and the secondary side. Therefore, a balun transformer is particularly beneficial in radiofrequency power amplifiers according to the present disclosure, where high impedance ratios need to be bridged and thus is of particular importance when using power transistors of for instance the LDMOS-type.

Balun transformers according to the present disclosure advantageously have power ratings of at least 100 W, advantageously between 500 W and 5 kW.

A balun transformer in power amplifiers of the present disclosure comprises a balanced coil, an unbalanced coil and at least one auxiliary coil. The auxiliary coil is advantageously arranged as a balanced type coil, but may alternatively be arranged as an unbalanced type coil. Depending on the type of auxiliary coil (i.e. balanced or unbalanced), the auxiliary coil either assists the balanced or the unbalanced coil. In case the at least one auxiliary coil is of the balanced type it assists the balanced coil. In case the at least one auxiliary coil is of the unbalanced type, it assists the unbalanced coil.

The auxiliary coil can be connected in two ways to the balanced coil, namely as a Series Combining Transformer (SCT) or a Parallel Combining Transformer (PCT), depending on how the windings of the unbalanced coil which couple inductively to the auxiliary coil and the windings which couple inductively to the balanced coil are connected, i.e. either in series across the load or in parallel. For high power level applications a SCT configuration is beneficial due to the impact on the impedance transformation ratio, which is proportional to the number of combined transistors. For instance, if the impedance transformation ratio is 5 for a planar balun according to the state of the art, it will be 10 for a planar balun according an embodiment of the present disclosure wherein two coils are combined. This makes impedance transformation easier.

If the coils are operated in resonance, the impedance ratio and efficiency can largely be improved at the expense of operating bandwidth. A convenient and beneficial method of coupling the transistors of a power amplifier comprising the balun transformer according to the present disclosure is by using a push-pull configuration, possibly in combination with a higher efficiency mode such as Class-B operation. This reduces even harmonics greatly.

The power transistor pairs in the radiofrequency power amplifiers of the present disclosure advantageously comprise discrete (power) transistors, e.g. of the LDMOS or VDMOS type. The power transistors can be GaN (gallium nitride) transistors.

The layout of the power combiner is important for good performance. Simple coils with a single winding axis and winding direction (e.g. circular shaped coils, rectangular shaped coils) will give modest performance. For instance, if two balanced circular shaped coils are transformingly coupled to a single unbalanced circular shaped coil and are at the center connected to a DC potential, such as the supply voltage or ground, both balanced coil "legs" need to have the same coupling to the unbalanced coil. If there is an unbalance in the balanced coils, this will have major impact on the push-pull behavior, benefits and performance. In such situations preferably a figure "8" shaped unbalanced coil is used. One major benefit is the symmetrical flux coupling from the unbalanced coil to the balanced coil legs. Due to the opposite current direction between adjacent windings, the flux cancellation is minimized and magnetic coupling is improved. Another important benefit when an even number of windings is used is the cancellation of external common-mode coupling. It goes without saying that this also applies in the other situation where two unbalanced coils are transformingly coupled to a balanced coil that is shaped in a figure "8".

Preferably a figure "8" shaped coil is printed on two planes of a PCB. This can be extrapolated to a coil with multiple adjacent lobes, in particular a coil comprising an even number of adjacent lobes connected to one another to advantageously form a sequence of multiple connected figure-8 shaped coils. In the latter case, the balun transformer advantageously comprises multiple auxiliary coils associated to the additional lobes. It is beneficial if the lobes of the figure "8" shaped coil are arranged on a first plane of the PCB and that these lobes are connected by a conductor arranged on a second plane. This has the advantage that the layout is symmetrical (and thus the coils have equal coupling), and fields of adjacent coils cancel one another. In a preferred embodiment, the lobes of the figure "8" shaped coil are connected such that the conductors connecting the two lobes run in parallel on two planes of the PCB. Doing so reduces the common mode gain.

Preferably, the coils that are to be combined are printed on a single plane of the PCB. Beneficially, a shielding conductor is placed between the coils that are to be combined. This reduces the coupling between these coils. Such shielding conductor may be grounded. In embodiments where only circular shaped coils are used, a balun transformer according to the present disclosure may be arranged on two planes of a PCB. Embodiments that comprise a figure-"8" shaped coil are preferably printed on three planes of a PCB.

Instead of power combining, aspects of the present disclosure are also beneficial for power dividing.

The disclosure further relates to an MRI system or a plasma generator comprising such RF power amplifiers.

The present disclosure also relates to the use of a power amplifier wherein the balun transformer as described herein is operated in a signal frequency range between 1 MHz and 500 MHz.

BRIEF DESCRIPTION OF THE FIGURES

Aspects of the present disclosure will now be described in more detail with reference to the appended drawings, wherein same reference numerals illustrate same features and wherein:

FIG. 2A shows a cross section of the balun transformer of FIG. 1.

DESCRIPTION OF EMBODIMENTS

Figure 1:
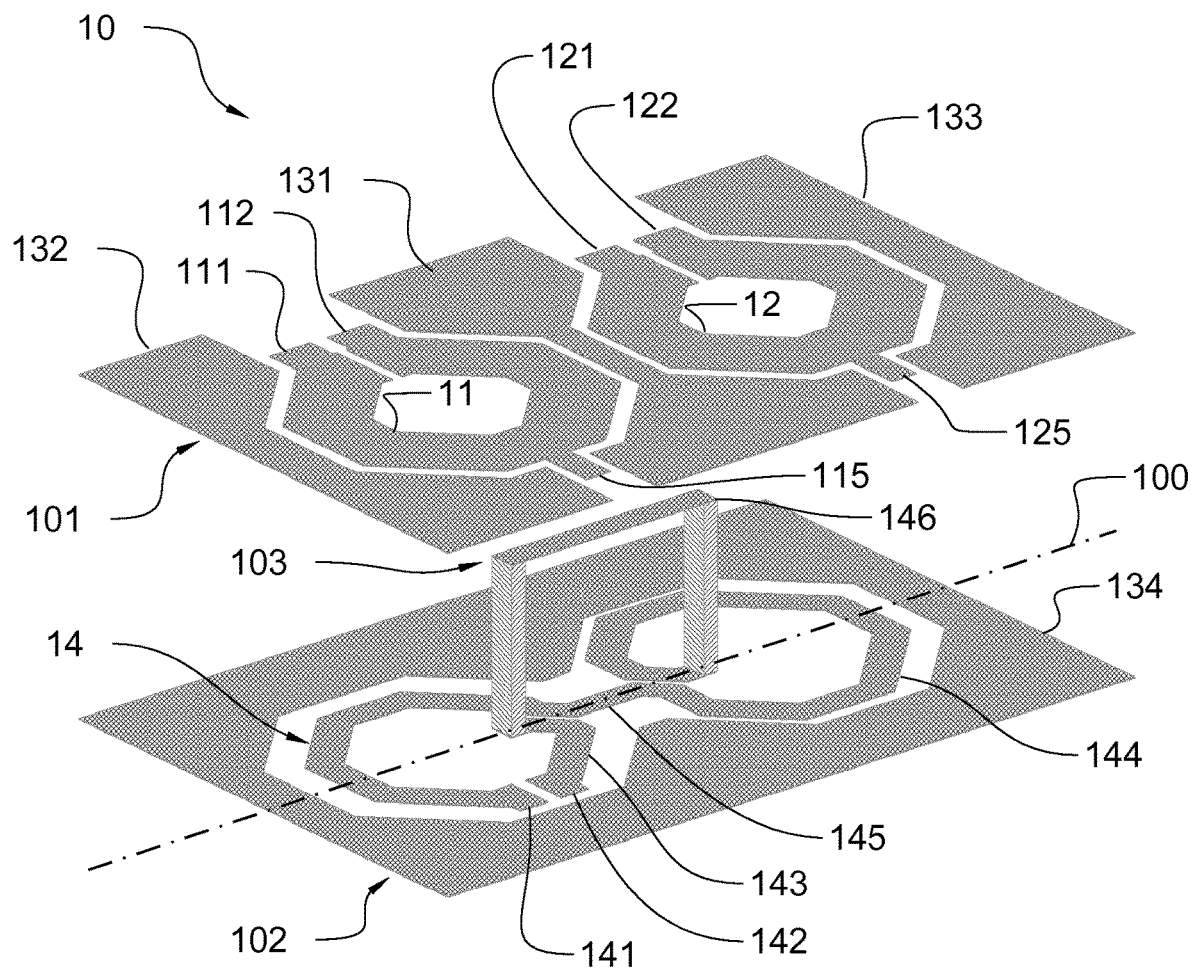
FIG. 1 represents a perspective view of a balun transformer according to aspects described herein.

Referring to FIG. 1, a balun transformer 10 according to aspects described herein comprises a balanced coil 11 and an auxiliary coil 12 of the balanced type in a first plane 101 of a PCB. The balanced coil and auxiliary coil are made from traces of a conductive material and each have a first balanced signal terminal 111, 121 and a second balanced signal terminal 112, 122 respectively. These first and second signal terminals 111, 121, 112, 122 can be connected to a radio frequent AC power source. Furthermore, each of the coils 11, 12 can comprise a reference port 115, 125 respectively (e.g. DC-feed or ground) which can be connected to a DC power source. The first balanced signal terminal 111, 121 and the second balanced signal terminal 112, 122 of the balanced coil 11 and the auxiliary coil 12 respectively, advantageously extend in electrical symmetry from the reference port 115, 125. Advantageously, a shielding conductor 131 is placed between the balanced coil 11 and the auxiliary coil 12 in the first plane 101. Additional shielding conductors 132, 133 can be arranged in the first plane 101 of the PCB at each opposite end of the balanced coil 11 and the auxiliary coil 12, adjacent to the outer traces of conductive material. The shielding conductors 131, 132 and 133 may be connected to a reference potential (e.g. ground).

The balun transformer 10 further comprises an unbalanced coil 14 in a second plane 102 and a third plane 103 of the PCB. The unbalanced coil 14 comprises two lobes 143, 144 forming a figure-"8" shape extending between a single-ended signal port 142 and a reference port 141, for instance connected to ground. The two lobes 143, 144 of the unbalanced coil 14 are arranged in the second plane 102 of the PCB. The connection between the two lobes 143, 144 is provided by a first conductor 145 arranged in the second plane 102 and a second conductor 146 arranged in the third plane 103. Beneficially, the first conductor 145 and the second conductor 146 are substantially parallel extending traces. By so doing, the magnetic fields produced by the first conductor 145 and the second conductor 146 advantageously cancel one another. Conductive material 134 may be provided to surround the unbalanced coil 14 in the second plane 102. This conductive material 134 may be connected to the reference port 141.

As shown in FIG. 1, the balanced coil 11 and the auxiliary coil 12 are arranged in correspondence with respective lobes 143, 144 of the unbalanced coil 14. The conductors 145 and 146 connect the two lobes 143 and 144 such that electric current between ports 141 and 142 flows in the two lobes 143 and 144 in opposite sense. As a result, the two lobes 143, 144 of the unbalanced coil 14 are of different polarity. Therefore, the balanced coils 11, 12 will also operate at different polarity. Beneficially, either end of conductors 145, 146 is substantially equidistant from the center of the corresponding balanced coils 11, 12 and equidistant from the corresponding centers of lobes 143, 144. The conductive traces in any of the balanced coil 11, the auxiliary coil 12 and the unbalanced coil 14 advantageously have suitable width to minimize resistive losses when a designed electric current flows through the coil. In the example of FIG. 1, the balanced coil 11 and the auxiliary coil 12 have a larger width than the conductive traces of the unbalanced coil 14 to reduce the losses that may arise because of the larger currents in the balanced coil 11 and the auxiliary coil 12.

Figure 2A:
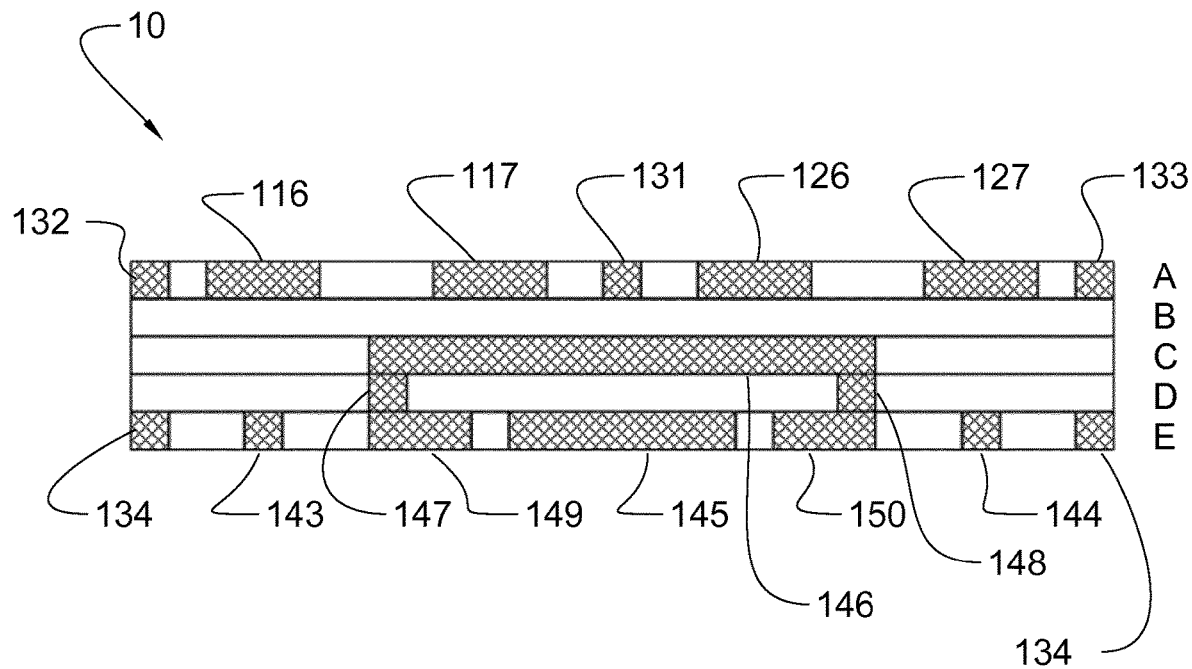
FIG. 2A represents a cross section of a possible PCB implementation of the balun transformer of FIG. 1 along the center longitudinal axis according to aspects described herein.

FIG. 2A shows a cross section of a PCB implementation along the center longitudinal axis 100 of the balun transformer of FIG. 1. The PCB comprises (at least) 5 consecutively stacked layers or planes A, B, C, D, E. The top plane A corresponding to the first plane 101 of FIG. 1 comprises the conductive traces 116, 117 of the balanced coil and the conductive traces 126, 127 of the auxiliary coil. Shielding conductors 131, 132 and 133 may also be placed in the top plane A. Plane B is an insulating layer advantageously not comprising any conductive material. Plane C corresponds to the third plane 103 of FIG. 1 and comprises the second conductor 146 that is connected to conductive traces 149 and 150 of the unbalanced coil in plane E via corresponding conductive traces 147 and 148. The second conductor 146, conductive traces 149 and 150 together with the first conductor 145 arranged in plane E provide the connection between the two lobes of the figure "8" unbalanced coil 14. Plane E corresponds to the second plane 102 of FIG. 1 and further comprises the other conductive traces that form lobes 143, 144 of the unbalanced coil 14. Beneficially, plane E also comprises shielding conductive material 134 surrounding the unbalanced coil 14.

Figure 2B:
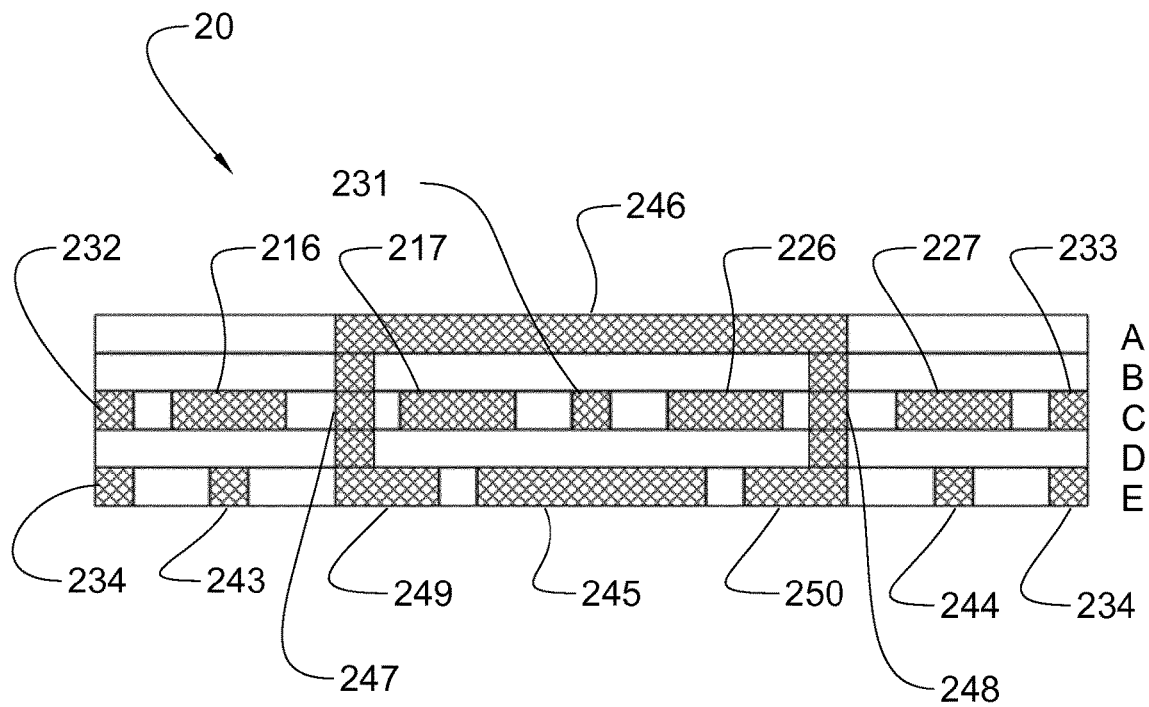
FIG. 2B shows a cross section of a balun transformer of FIG. 1, wherein the layer with the balanced and the auxiliary coil is arranged in an intermediate plane between the planes of the conductive paths connecting the two lobes of the figure "8" coil.

FIG. 2B shows an alternative embodiment of a PCB implementation of a balun transformer 20 according to the present disclosure. FIG. 2B differs from the implementation of FIG. 2A in that the planes A and C (i.e., the first plane and the third plane of FIG. 1) are swapped. That is, the plane comprising the balanced coil and auxiliary coil is now interposed between the plane comprising the lobes of the unbalanced coil and the plane comprising the second conductor. Also in this embodiment, the PCB comprises 5 planes A, B, C, D, E. Plane C comprises the conductive traces 216, 217 of the balanced coil and the conductive traces 226, 227 of the auxiliary coil. Shielding conductors 231, 232 and 233 may also be placed in plane C. Plane A comprises the second conductor 246 that is connected to conductive traces 249 and 250 of the unbalanced coil in plane E via corresponding conductive traces 247 and 248 in planes B, C and D. The second conductor 246, conductive traces 249 and 250 together with the first conductor 245 arranged in plane E provide the connection between the two lobes of the figure "8" unbalanced coil. Plane E further comprises the other conductive traces 243 and 244 that form part of the unbalanced coil. Beneficially, plane E also comprises shielding conductive material 234 surrounding the unbalanced coil.

Alternatively, the balun transformer 10, 20 shown in FIGS. 1, 2A and 2B can also be arranged as a combiner-divider with an unbalanced coil 11 and an auxiliary coil 12 of the unbalanced type in a first plane of a PCB and a balanced coil arranged in at least two other planes, e.g. as a figure-"8" coil. In this arrangement, one of the signal terminals of the unbalanced coil and one of the signal terminals of the auxiliary coil may function as single-ended signal ports, while the other one of the above signal terminals may function as reference ports. Furthermore, in this arrangement the balanced coil comprises two balanced signal terminal.

Figure 3:
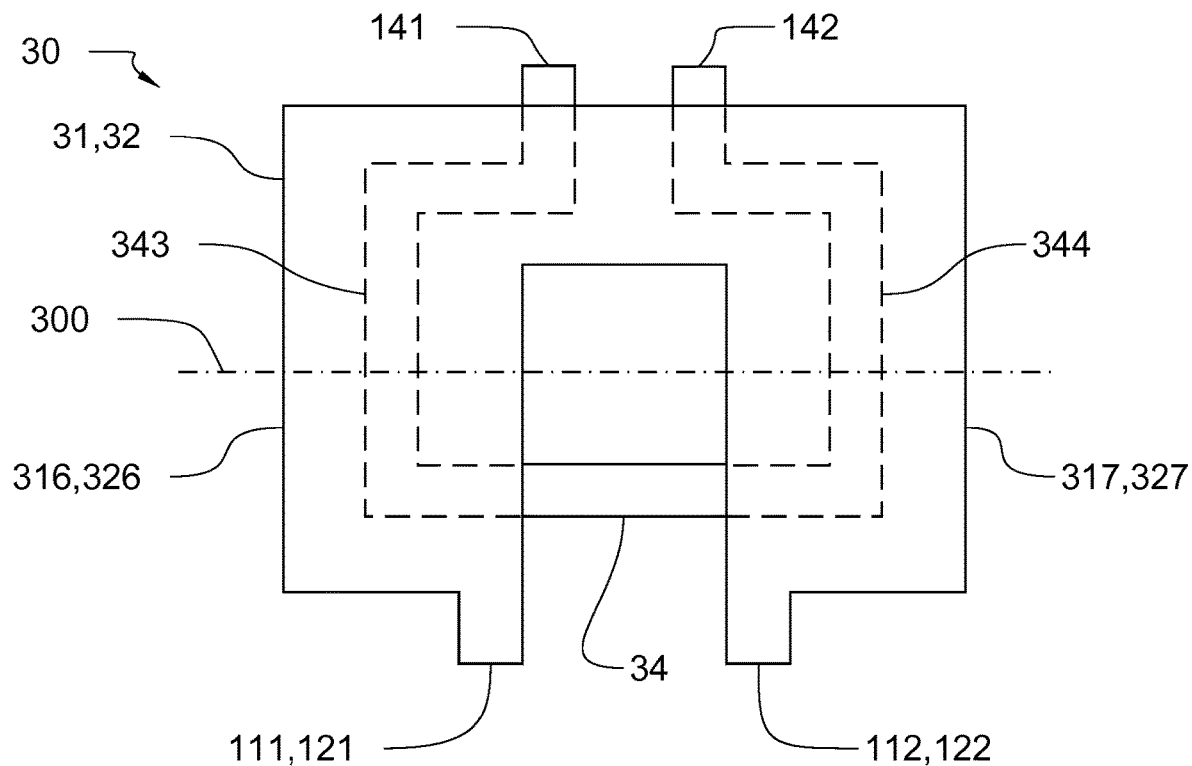
FIG. 3 represents a plan view of another balun transformer according to aspects described herein.
Figure 4:
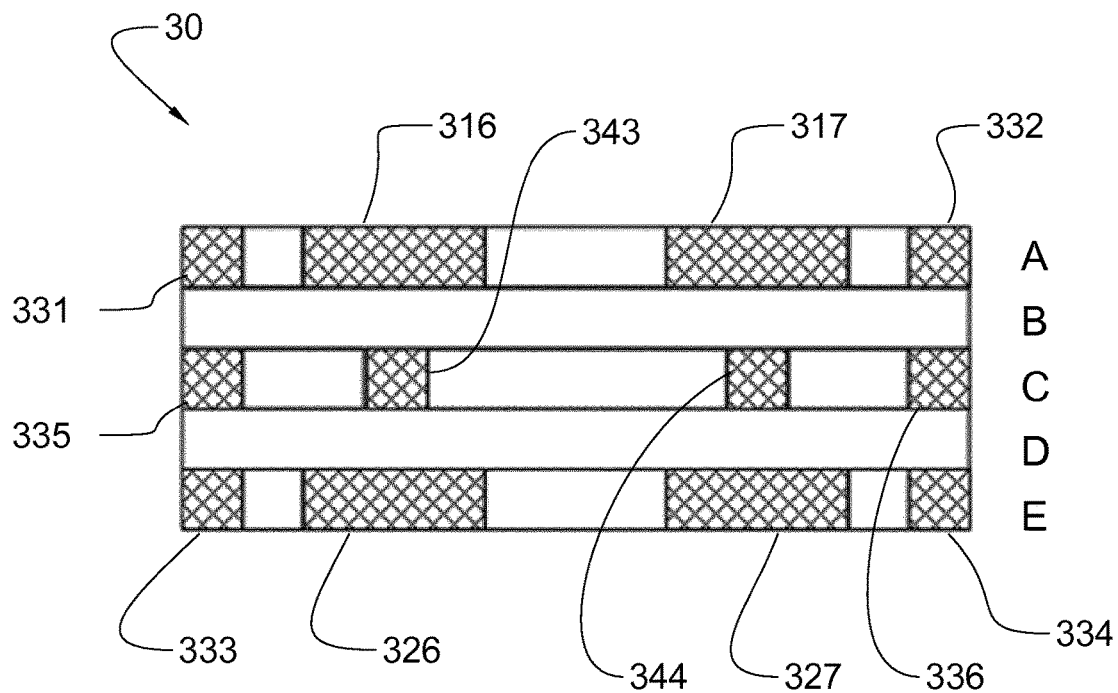
FIG. 4 represents a cross section of a PCB implementation of the balun transformer of FIG. 3 along a center longitudinal axis according to aspects described herein, wherein a balanced coil, an auxiliary coil and an unbalanced coil are substantially arranged in different planes.

FIG. 3 shows an alternative embodiment of a balun transformer 30 according to the present disclosure, and FIG. 4 shows the corresponding PCB implementation in cross section along center axis 300. In the present embodiment, the balanced coil 31 and the auxiliary coil 32 are stacked on top of each other. The unbalanced coil 34 is interposed between the planes of the balanced coil 31 and of the auxiliary coil 32. The PCB implementation comprises 5 planes A, B, C, D, E. Planes A comprises the conductive traces 316, 317 of the balanced coil 31. Shielding conductors 331, 332 for the balanced coil 31 can be provided in plane A. Plane E comprises the conductive traces 326, 327 of the auxiliary coil 32. Shielding conductors 333, 334 for the auxiliary coil 32 may be provided in Plane E. Planes B and D advantageously do not comprise any conductive traces and function as isolating planes between plane A and C and between plane C and E respectively. Plane C comprises the conductive traces 343, 344 of the unbalanced coil 34. Shielding conductors 335, 336 for the unbalanced coil can be provided in plane C. Needless to say, the balun transformer 30 can alternatively be designed such that coil 34 acts as a balanced coil (i.e., ports 141, 142 are balanced signal terminals), whereas coils 31 and 32 act as unbalanced coils (i.e. ports 111, 112, 121, 122 are unbalanced) hence obtaining a power divider.

Figure 5:
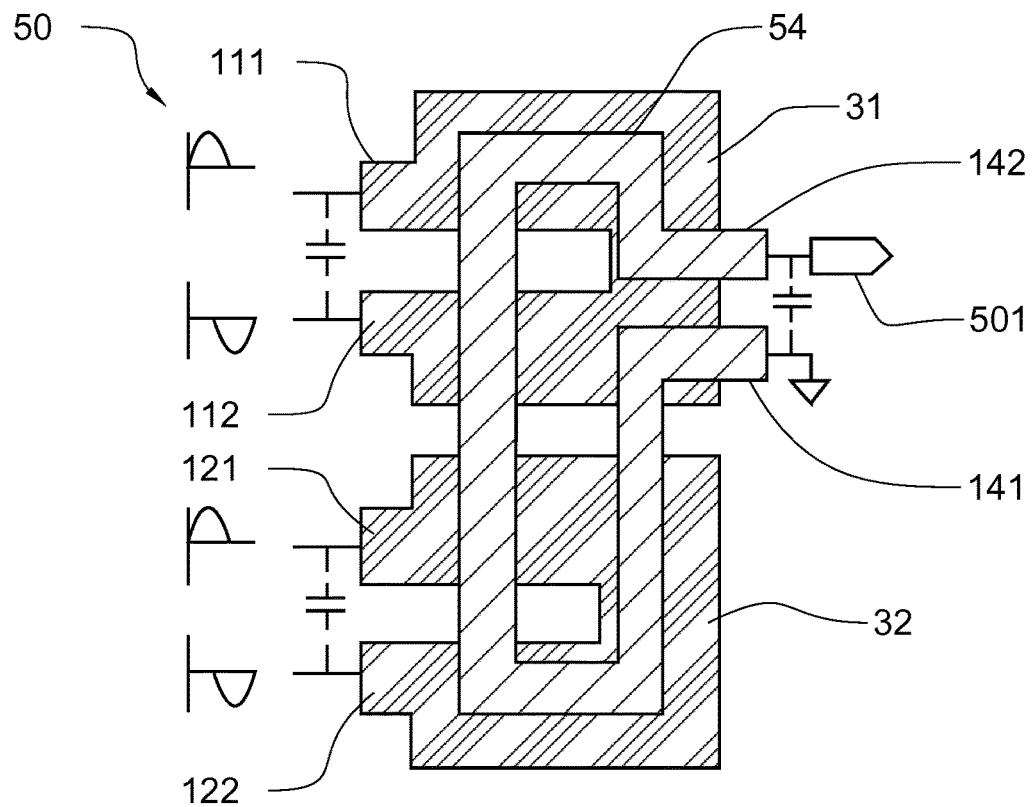
FIG. 5 represents a plan view of yet another balun transformer according to aspects described herein.

FIG. 5 shows yet another alternative of a balun transformer according to aspects described herein. Balun transformer 50 differs from balun transformer 30 of FIG. 3 in that the balanced coil 31 and the auxiliary coil 32 are juxtaposed in a same plane. The unbalanced coil 54 is hence made to extend over both balanced and auxiliary coils. The single-ended port 142 of the unbalanced coil 54 is connected to a single-ended output 501. The present embodiment presents some asymmetry in the inductive coupling compared to the figure-"8" shaped embodiment as shown in FIG. 1.

It will be convenient to note that embodiments of the balun transformer as described herein need not be provided as PCB implementations, and can alternatively be provided as floating planes (e.g., spaced apart by an air gap) and/or as non-printed configurations. Balun transformers as described herein can be provided as conducting paths, e.g. copper plates or traces, arranged on an isolating support (layer), in particular a ceramic support.

Figure 6:
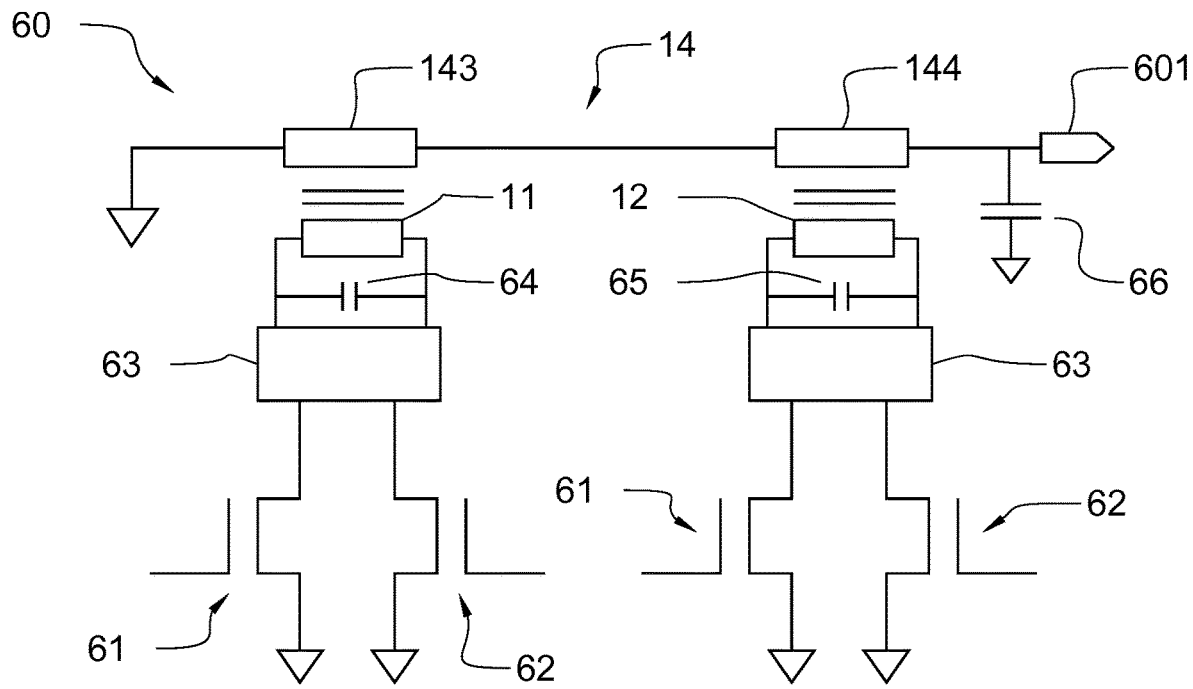
FIG. 6 shows a schematic representation of a RF power amplifier implementing a balun transformer according to the present disclosure as a balanced combiner.

Referring to FIG. 6, a radiofrequency power amplifier 60, such as those used in MRI systems, comprises multiple sets of a pair of power transistors 61, 62 arranged in a push-pull configuration. Power transistors 61, 62 are advantageously LDMOS transistors, but may alternatively be of another type, such as VDMOS. Each pair of power transistors 61, 62 is optionally coupled to an impedance matching circuit 63 and further coupled to the balanced coil 11, or the auxiliary coil 12 of a balun transformer as described hereinabove, e.g. to balun transformer 10. The balanced and auxiliary coils are inductively coupled to the unbalanced coil 14 so as to obtain a power combining circuit.

As shown in FIG. 6, the radiofrequency power amplifier 60 can further comprise a first capacitor 64, a second capacitor 66 and a third capacitor 65, for example. The first capacitor 64 is connected to the balanced coil 11 forming a first parallel resonant tank circuit, the second capacitor 66 is connected to the unbalanced coil 14 forming a second parallel resonant tank circuit, and the third capacitor 65 is connected to the auxiliary coil 12 forming a third parallel resonant tank circuit.

The radiofrequency power amplifier comprises a single-ended output 601 which is coupled to a terminal port of the unbalanced coil 14.

Figure 7:
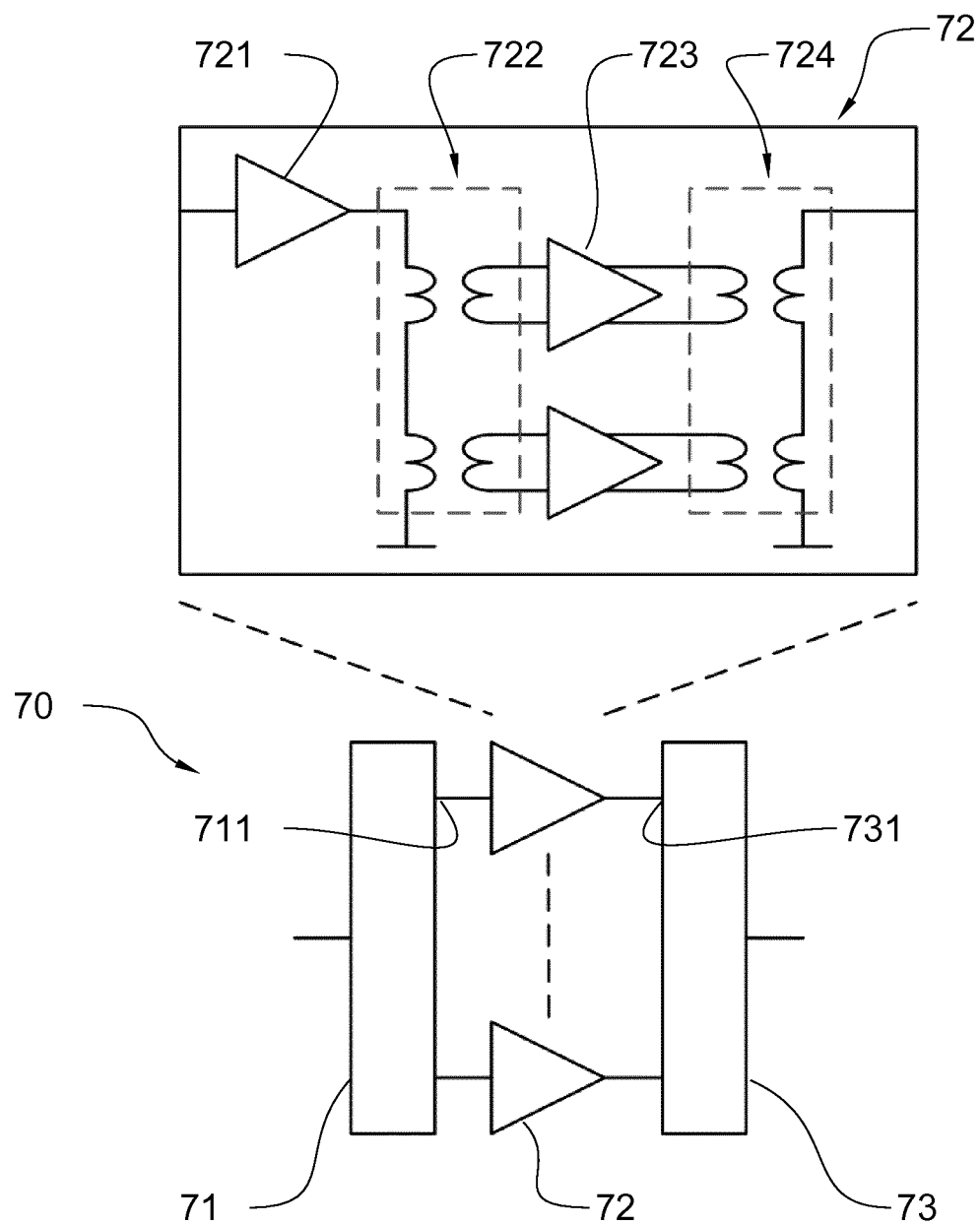
FIG. 7 represents a scheme of a RF power amplifier implementing a balun power divider and a balun power combiner according to the present disclosure.

Referring to FIG. 7, a general layout of a radiofrequency amplifier 70 according to the present disclosure, comprises an array of amplifier modules 72 arranged between a power splitter 71, such as a Wilkinson splitter and a power combiner 73, such as a Wilkinson combiner. The layout of the amplifier modules 72 is shown in an enlarged view in FIG. 7. Each amplifier module 72 can be built as the amplifier 60 shown in FIG. 6. In particular, the amplifier module 72 comprises a pair of push-pull stages 723. Each push-pull stage 723 can be built as a pair of power transistors, which can be LDMOS, VDMOS or any other suitable kind, arranged in push-pull configuration. LDMOS transistors feature very high power levels at low drain voltage which directly results in low load impedances (e.g. <5R in push-pull operation) which need to be transformed to the standard 50R characteristic impedance. Therefore transistors with these high power levels configured in push-pull (balanced) result in four times higher load impedances.

The balanced signal terminals of a balun power divider 722 are connected to the pair of push-pull stages 723. Balun power divider 722 comprises, or consists of a balun transformer as described herein. The single ended signal terminal of balun power divider 722 is connected to an output 711 of the power divider 71, possibly via a pre-amplifier 721 allowing for generating sufficient power. The outputs of the push-pull stages 723 are connected to the balanced signal terminals of a balun power combiner 724, which can comprise or consist of a balun transformer as described herein. The single ended signal terminal of balun power combiner 724 is connected to an input 731 of the power combiner 73. Combining two baluns which together fulfill the combiner functionality results in a major reduction of combiners and therefore also a major reduction in losses.

A RF power amplifier according to aspects of the present disclosure can be used for industrial, scientific and medical applications.

The invention claimed is:

1. A radiofrequency power amplifier, comprising:
   a first balun transformer and a plurality of power transistor pairs, each of the plurality of power transistor pairs arranged in a push-pull configuration;
   wherein the first balun transformer comprises an unbalanced coil extending between a first single-ended signal terminal and a first reference port and a balanced coil extending between a first balanced signal terminal and a second balanced signal terminal;
   wherein the unbalanced coil and the balanced coil are inductively coupled and electrically isolated from each other;
   wherein the first balun transformer further comprises at least one auxiliary coil electrically isolated from the unbalanced coil and the balanced coil;
   wherein the at least one auxiliary coil is inductively coupled to the unbalanced coil and extends between a third balanced signal terminal and a fourth balanced signal terminal forming a balanced combiner;
   wherein an output of a first one of the plurality of power transistor pairs is coupled to the first and second balanced signal terminals; and
   wherein an output of a second one of the plurality of power transistor pairs is coupled to the third and fourth balanced signal terminals.

2. The radiofrequency power amplifier according to claim 1, wherein the balanced coil, the unbalanced coil and the auxiliary coil are arranged in a plurality of spaced apart parallel planes.

3. The radiofrequency power amplifier according to claim 2, wherein the auxiliary coil is arranged in a same one of the plurality of spaced apart parallel planes as the balanced coil.

4. The radiofrequency power amplifier according to claim 2, wherein the plurality of spaced apart parallel planes form layers of a printed circuit board.

5. The radiofrequency power amplifier according to claim 4, wherein the balanced coil, the unbalanced coil and the auxiliary coil are formed by conductive traces in the layers of the printed circuit board.

6. The radiofrequency power amplifier according to claim 1, wherein the first balanced signal terminal and the second balanced signal terminal extend in electrical symmetry from a third reference port.

7. The radiofrequency power amplifier according to claim 6, wherein the third balanced signal terminal and the fourth balanced signal terminal extend in electrical symmetry from a fourth reference port.

8. The radiofrequency power amplifier according to claim 1, wherein the unbalanced coil forms a figure-8 coil comprising a first lobe and a second lobe electrically connected to each other, wherein the first lobe is inductively coupled to the balanced coil and the second lobe is inductively coupled to the auxiliary coil.

9. The radiofrequency power amplifier according to claim 8, wherein the first lobe and the second lobe are conductively connected by parallel conductors arranged in different spaced apart parallel planes.

10. The radiofrequency power amplifier according to claim 8, wherein the first lobe and the second lobe of the figure-8 coil are electrically connected such that an electric current flows in opposite sense in the first lobe and in the second lobe.

11. The radiofrequency power amplifier according to claim 1, wherein the balanced coil and the auxiliary coil are arranged in a same plane and wherein a shielding conductor extends between the balanced coil and the auxiliary coil.

12. The radiofrequency power amplifier according to claim 1, further comprising:
    a first capacitor, a second capacitor and a third capacitor;
    wherein the first capacitor is connected to the balanced coil forming a first parallel resonant tank circuit;
    wherein the second capacitor is connected to the unbalanced coil forming a second parallel resonant tank circuit; and
    wherein the third capacitor is connected to the auxiliary coil forming a third parallel resonant tank circuit.

13. The radiofrequency power amplifier according to claim 1, wherein the plurality of power transistor pairs comprise LDMOS transistors or VDMOS transistors.

14. The radiofrequency power amplifier of claim 1, wherein the first balun transformer is configured as a series combining transformer.

15. The radiofrequency power amplifier according to claim 1, further comprising:
    a power divider, wherein the power divider comprises a second balun transformer,
    wherein the second balun transformer comprises an unbalanced coil extending between a first single-ended signal terminal of the second balun transformer and a first reference port of the second balun transformer and a balanced coil extending between a first balanced signal terminal and a fourth balanced signal terminal of the second balun transformer;
    wherein the unbalanced coil and the balanced coil of the second balun transformer are inductively coupled and electrically isolated from each other;
    wherein the second balun transformer further comprises at least one auxiliary coil electrically isolated from the unbalanced coil and the balanced coil of the second balun transformer;
    wherein the at least one auxiliary coil of the second balun transformer is inductively coupled to the unbalanced coil of the second balun transformer and extends between a third balanced signal terminal and a fourth balanced signal terminal of the second balun transformer, and the second balun transformer forms a balanced divider;
    wherein the first, second, third and fourth balanced signal terminals of the second balun transformer are coupled to the plurality of power transistor pairs.

16. The radiofrequency power amplifier of claim 1, wherein the first balun transformer and the plurality of power transistor pairs are arranged in an amplifier stage, wherein the radiofrequency power amplifier comprises a plurality of the amplifier stage arranged in an array of amplifier stages.

17. A Magnetic Resonance Imaging (MRI) system comprising a radiofrequency power amplifier according to claim 1.

18. A plasma generator comprising a radiofrequency power amplifier according to claim 1.

19. The radiofrequency power amplifier according to claim 1, wherein the first balun transformer operates in a signal frequency range between 1 MHz and 500 MHz.

* * * * *